(12) United States Patent
Lin et al.

(10) Patent No.: US 10,050,603 B2
(45) Date of Patent: Aug. 14, 2018

(54) FREQUENCY TUNABLE FILTER WITH VOLTAGE STRESSED RELAXED SWITCH, AND ASSOCIATED APPARATUS

(71) Applicant: MEDIATEK INC., Hsin-Chu (TW)

(72) Inventors: Chien-Cheng Lin, Taichung (TW); Jui-Chih Kao, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/242,619

(22) Filed: Aug. 22, 2016

(65) Prior Publication Data

US 2017/0126205 A1    May 4, 2017

Related U.S. Application Data

(60) Provisional application No. 62/251,075, filed on Nov. 4, 2015.

(51) Int. Cl.
| | | |
|---|---|---|
| *H03K 5/00* | (2006.01) | |
| *H03H 11/04* | (2006.01) | |
| *H03H 7/01* | (2006.01) | |

(52) U.S. Cl.
CPC ........... *H03H 11/04* (2013.01); *H03H 7/0115* (2013.01); *H03H 7/0153* (2013.01);
(Continued)

(58) Field of Classification Search
CPC ............... H03H 11/0422; H03H 11/04; H03H 11/1291; H03H 11/1213; H03K 5/1252
(Continued)

(56) References Cited

U.S. PATENT DOCUMENTS

| 4,939,486 A | * 7/1990 | Bergdahl ................. H03H 7/06 307/105 |
|---|---|---|
| 6,625,470 B1 | 9/2003 | Fourtet |
| | (Continued) | |

FOREIGN PATENT DOCUMENTS

| EP | 1079534 A2 | 2/2001 |
|---|---|---|
| EP | 1536557 A1 | 6/2005 |
| EP | 2128979 A1 | 12/2009 |

OTHER PUBLICATIONS

EP 16186358.4, Mar. 31, 2017, Extended European Search Report.
Extended European Search Report for Application No. EP 16186358.4 dated Mar. 31, 2017.

*Primary Examiner* — Dinh T Le
(74) *Attorney, Agent, or Firm* — Wolf, Greenfield & Sacks, P.C.

(57) ABSTRACT

A frequency tunable filter and an associated apparatus are provided, where the frequency tunable filter may include a plurality of ports including an input port and an output port, and may further include an inductor-capacitor (LC) resonator, a switching unit that is coupled between the LC resonator and a ground terminal of the frequency tunable filter, and a resonance adjustment unit that is coupled between the LC resonator and the ground terminal. For example, the LC resonator may include a first terminal coupled to each of the input port and the output port, and may further include a second terminal, the switching unit may selectively provide a conduction path between the second terminal of the LC resonator and the ground terminal, and the resonance adjustment unit may selectively change a resonance characteristic of the LC resonator.

24 Claims, 3 Drawing Sheets

(52) U.S. Cl.
CPC ..... *H03H 7/1758* (2013.01); *H03H 2007/013* (2013.01); *H03H 2210/025* (2013.01); *H03H 2210/026* (2013.01)

(58) Field of Classification Search
USPC .................................................. 327/552–559
See application file for complete search history.

(56) References Cited

U.S. PATENT DOCUMENTS

| | | | |
|---|---|---|---|
| 7,391,281 B2* | 6/2008 | Chao | G06F 17/5063 333/32 |
| 8,665,038 B2* | 3/2014 | Belot | H03H 9/542 333/17.1 |
| 9,246,536 B2* | 1/2016 | Caron | H04B 1/52 |
| 2010/0291946 A1 | 11/2010 | Yamakawa et al. | |

\* cited by examiner

FREQUENCY TUNABLE FILTER WITH VOLTAGE STRESSED RELAXED SWITCH, AND ASSOCIATED APPARATUS

CROSS REFERENCE TO RELATED APPLICATIONS

This application claims the benefit of U.S. Provisional Application No. 62/251,075, which was filed on Nov. 4, 2015, and is included herein by reference.

BACKGROUND

The present invention relates to filtering control of a portable electronic device such as that capable of performing wireless communications, and more particularly, to a frequency tunable filter and an associated apparatus.

According to the related art, a conventional portable electronic device such as a multifunctional mobile phone may be designed to have the capability of performing wireless communications based on various well-developed and well-defined wireless communications technologies (e.g. Global System for Mobile communications (GSM) technologies, Enhanced Data rates for GSM Evolution (EDGE) technologies, High Speed Packet Access (HSPA) technologies, etc.), and may be equipped with different power amplifiers (PAs) corresponding to different transmission paths. For example, one PA may need to have an industrial, scientific and medical (ISM)-band filter at the EDGE mode to prevent a 2.4 Gigahertz (GHz) signal from being coupled to another PA. However, this ISM-band filter is not needed in the GSM mode, and it will cause extra power loss in the GSM mode. Thus, a novel architecture is required for performing filtering control, in order to guarantee the overall performance of an electronic device.

SUMMARY

It is an objective of the claimed invention to provide a frequency tunable filter and an associated apparatus, in order to solve the above-mentioned problems.

It is another objective of the claimed invention to provide a frequency tunable filter and an associated apparatus, in order to guarantee the overall performance of an electronic device.

According to at least one preferred embodiment, a frequency tunable filter is provided, where the frequency tunable filter may comprise a plurality of ports comprising an input port and an output port, and may further comprise an inductor-capacitor (LC) resonator, a switching unit that is coupled between the LC resonator and a ground terminal of the frequency tunable filter, and a resonance adjustment unit that is coupled between the LC resonator and the ground terminal. For example, the LC resonator may comprise a first terminal coupled to the input port and the output port, and may further comprise a second terminal. In addition, the switching unit may be arranged to selectively provide a conduction path between the second terminal of the LC resonator and the ground terminal. Additionally, the resonance adjustment unit may be arranged to selectively change a resonance characteristic (e.g. a resonance frequency) of the LC resonator. For example, the resonance adjustment unit may change the resonance characteristic of the LC resonator according to the conduction path provided by the switching unit between the second terminal of the LC resonator and the ground terminal.

According to at least one preferred embodiment, an apparatus for performing filtering control in an electronic device is provided, where the apparatus may comprise at least one portion (e.g. a portion or all) of the electronic device. The apparatus may comprise a frequency tunable filter, and may comprise a controller that is coupled to the frequency tunable filter. More particularly, the frequency tunable filter may comprise a plurality of ports comprising an input port and an output port, and may further comprise an inductor-capacitor (LC) resonator, a switching unit that is coupled between the LC resonator and a ground terminal of the frequency tunable filter, and a resonance adjustment unit that is coupled between the LC resonator and the ground terminal. For example, the LC resonator may comprise a first terminal coupled to the input port and the output port, and may further comprise a second terminal. In addition, the switching unit may be arranged to selectively provide a conduction path between the second terminal of the LC resonator and the ground terminal. Additionally, the resonance adjustment unit may be arranged to selectively change a resonance characteristic (e.g. a resonance frequency) of the LC resonator. Further, the controller controls hardware configurations of the frequency tunable filter through the switching unit. For example, under control of the controller, the resonance adjustment unit may change the resonance characteristic of the LC resonator according to the conduction path provided by the switching unit between the second terminal of the LC resonator and the ground terminal.

It is an advantage of the present invention that the frequency tunable filter and the associated apparatus can perform filtering control with fewer side effects. In addition, the frequency tunable filter and the associated apparatus can guarantee the overall performance of an electronic device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
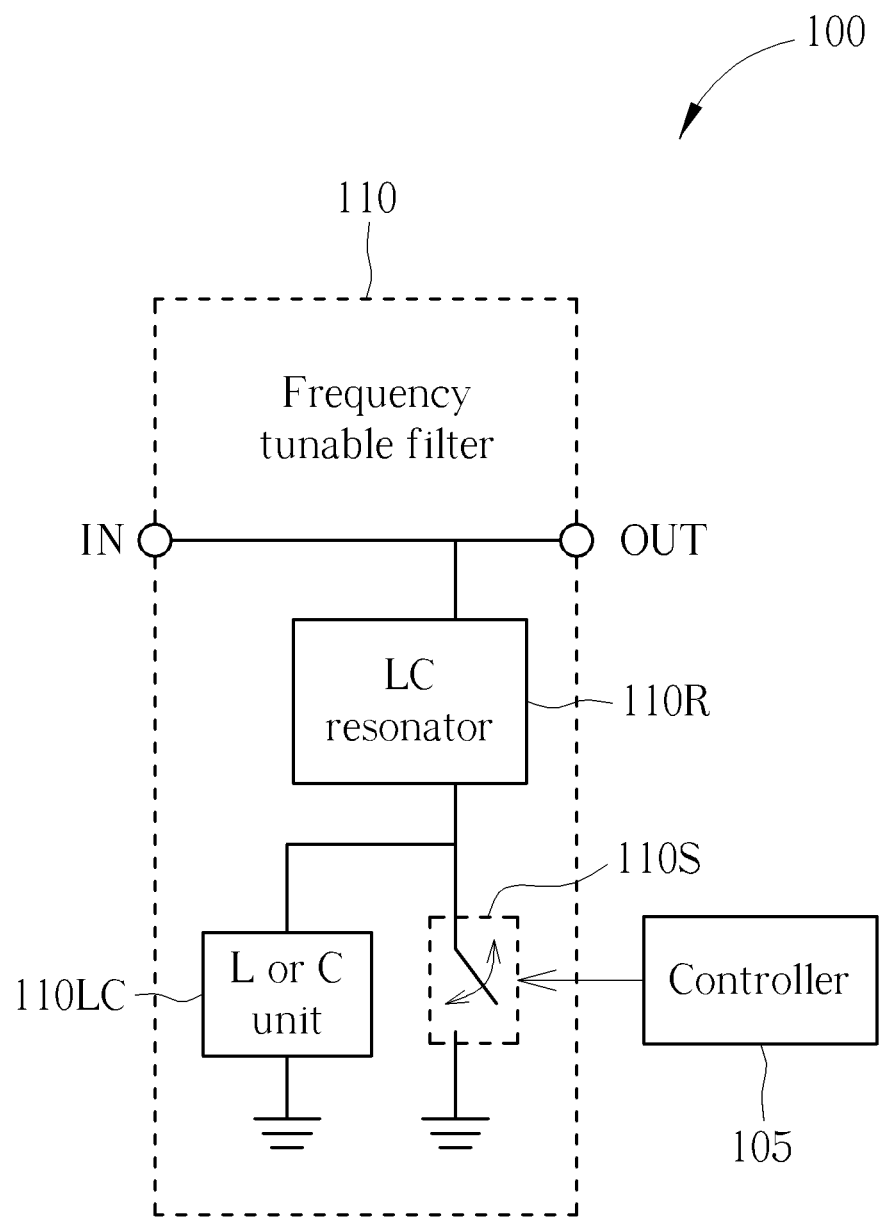
FIG. 1 is a diagram of an apparatus for performing filtering control in an electronic device according to a first embodiment of the present invention.

Please refer to FIG. 1, which illustrates a diagram of an apparatus 100 for performing filtering control in an electronic device according to a first embodiment of the present invention, where the apparatus 100 may comprise at least one portion (e.g. a portion or all) of the electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. a wireless communications system comprising the electronic device). Examples of the electronic device may include, but not limited to, a mobile phone (e.g. a multi-functional mobile phone), a tablet, and a personal computer such as a laptop computer.

As shown in FIG. 1, the apparatus 100 may comprise a controller 105 (e.g. a microcontroller, a microprocessor, a processing circuit such as a processor, etc.) and a frequency tunable filter 110, where the controller 105 and the frequency tunable filter 110 are both positioned in the electronic device, and are coupled to each other. More particularly, the frequency tunable filter 110 may comprise a plurality of ports comprising an input port IN and an output port OUT, and the input port IN and the output port OUT are coupled to each other. In addition, the frequency tunable filter 110 may further comprise an inductor-capacitor (LC) resonator 110R, a switching unit 110S that is coupled between the LC resonator 110R and a ground terminal of the frequency tunable filter 110, and a resonance adjustment unit such as an inductor or capacitor (L or C) unit 110LC, where the resonance adjustment unit such as the L or C unit 110LC is also coupled between the LC resonator 110R and the ground terminal. For example, the LC resonator 110R may comprise an inductor and a capacitor. In some embodiments, the switching unit 110S may comprise a field effect transistor. Examples of the field effect transistor may include, but not limited to, a Metal Oxide Semiconductor Field Effect Transistor (MOSFET). This is for illustrative purposes only, and is not meant to be a limitation of the present invention. According to some embodiments, implementation of the switching unit 110S may vary. In some embodiments, the resonance adjustment unit such as the L or C unit 110LC may comprise an inductor or a capacitor. For example, the L or C unit 110LC may be an inductor. In another example, the L or C unit 110LC may be a capacitor.

According to the embodiment shown in FIG. 1, the LC resonator 110R may comprise a first terminal (e.g. the upper terminal of the LC resonator 110R shown in FIG. 1) coupled to the input port IN and the output port OUT, and may further comprise a second terminal (e.g. the lower terminal of the LC resonator 110R shown in FIG. 1). In addition, the switching unit 110S may be arranged to selectively provide a conduction path between the second terminal of the LC resonator 110R and the ground terminal. Additionally, the resonance adjustment unit such as the L or C unit 110LC may be arranged to selectively change a resonance characteristic of the LC resonator 110R. Further, the controller 105 may control hardware configurations of the frequency tunable filter 110 through the switching unit 110S. For example, under control of the controller 105, the resonance adjustment unit such as the L or C unit 110LC may change the resonance characteristic of the LC resonator 110R according to the conduction path provided the switching unit 110S between the second terminal of the LC resonator 110R and the ground terminal. For example, the resonance characteristic may comprise a resonance frequency of the LC resonator 110R.

Examples of the hardware configurations mentioned above may include, but not limited to, a first configuration and a second configuration of the frequency tunable filter 110. According to some embodiments, when the frequency tunable filter 110 is of the first configuration, the switching unit 110S may provide the conduction path between the second terminal of the LC resonator 110R and the ground terminal. For example, when the frequency tunable filter 110 is of the first configuration, the switching unit 110S may disable the resonance adjustment unit such as the L or C unit 110LC by providing the conduction path between the second terminal of the LC resonator 110R and the ground terminal. According to some embodiments, when the frequency tunable filter 110 is of the second configuration, the switching unit 110S may block the conduction path between the second terminal of the LC resonator 110R and the ground terminal. For example, when the frequency tunable filter 110 is of the second configuration, the switching unit 110S may enable the resonance adjustment unit such as the L or C unit 110LC by blocking the conduction path between the second terminal of the LC resonator 110R and the ground terminal.

Figure 2:
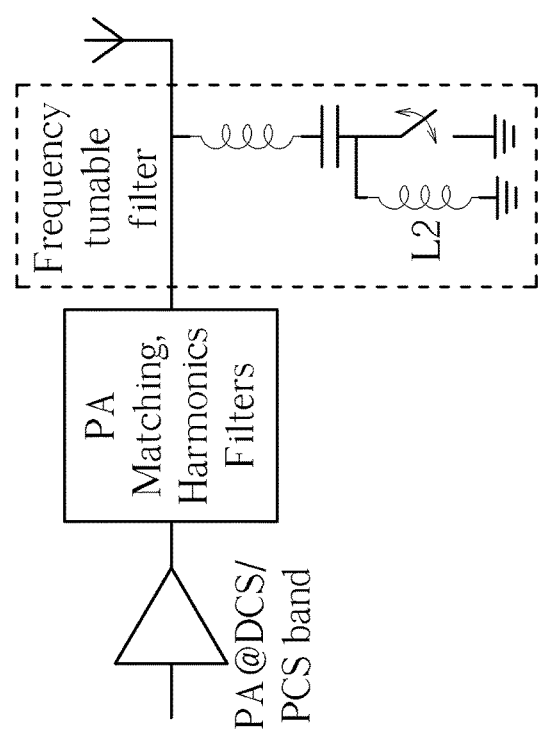
FIG. 2 illustrates a control scheme involved with the frequency tunable filter shown in FIG. 1 according to an embodiment of the present invention.

FIG. 2 illustrates a control scheme involved with the frequency tunable filter 110 shown in FIG. 1 according to an embodiment of the present invention. The architecture shown in FIG. 2 can be taken as an example of a transmitter circuit within the electronic device, and the frequency tunable filter shown in FIG. 2 can be taken as an example of the frequency tunable filter 110 shown in FIG. 1. For example, in addition to the frequency tunable filter, the transmitter circuit of this embodiment may comprise at least one power amplifier (PA) such as the DCS/PCS band PA (labeled "PA@DCS/PCS band" in FIG. 2) and may further comprise PA matching and harmonics filters (labeled "PA Matching, Harmonics Filters" in FIG. 2), where the output of the PA matching and harmonics filters may be coupled to an antenna.

According to this embodiment, the DCS/PCS band PA may operate at a Digital Cellular System (DCS) band or a Personal Communications Service (PCS) band (labeled "@DCS/PCS band" in FIG. 2, for better comprehension), and the PA matching and harmonics filters may perform PA matching and harmonics filtering for the DCS/PCS band PA. For example, the controller 105 may turn on the switching unit 110S to set up the first configuration of the frequency tunable filter shown in FIG. 2, where the DCS/PCS band PA is operating in the Global System for Mobile communications (GSM) mode, and the second terminal of the LC resonator 110R such as an LC filter (which may comprise an inductor having an inductance value L and comprise a capacitor having a capacitance value C, where the inductor and the capacitor of the LC filter are connected in series as shown in FIG. 2) is electrically connected to the ground terminal for PA second harmonic matching (e.g. 3.8 Gigahertz (GHz)). In another example, the controller 105 may turn off the switching unit 110S to set up the second configuration of the frequency tunable filter shown in FIG. 2, where the DCS/PCS band PA is operating in the Enhanced Data rates for GSM Evolution (EDGE) mode, and the second terminal of the LC resonator 110R (e.g. the LC filter) that is connected in series with the L or C unit 110LC (e.g. the inductor L2) may resonate at a rejection frequency (e.g. 2.4 GHz), the frequency that is lower than $1/(2*\pi*(L*C)^{1/2})$.

In a situation where the electronic device is designed to have the capability of performing wireless communications based on various wireless communications technologies (e.g. GSM technologies, EDGE technologies, High Speed Packet Access (HSPA) technologies, etc.), one PA such as the DCS/PCS band PA (labeled "PA@DCS/PCS band" in FIG. 2) may need to have an industrial, scientific and medical (ISM)-band filter at the EDGE mode to prevent the 2.4 GHz signal from being coupled to a Wireless-Fidelity (Wi-Fi) system. However, this ISM-band filter is not needed in the GSM mode, and it will cause extra power loss in the GSM mode. This problem can be resolved by using the frequency tunable filter 110 such as the frequency tunable filter shown in FIG. 2, and the frequency tunable filter having the frequency tunable feature is suitable for being utilized as a second harmonic filter and is also suitable for being utilized as an ISM-band filter.

Figure 3:
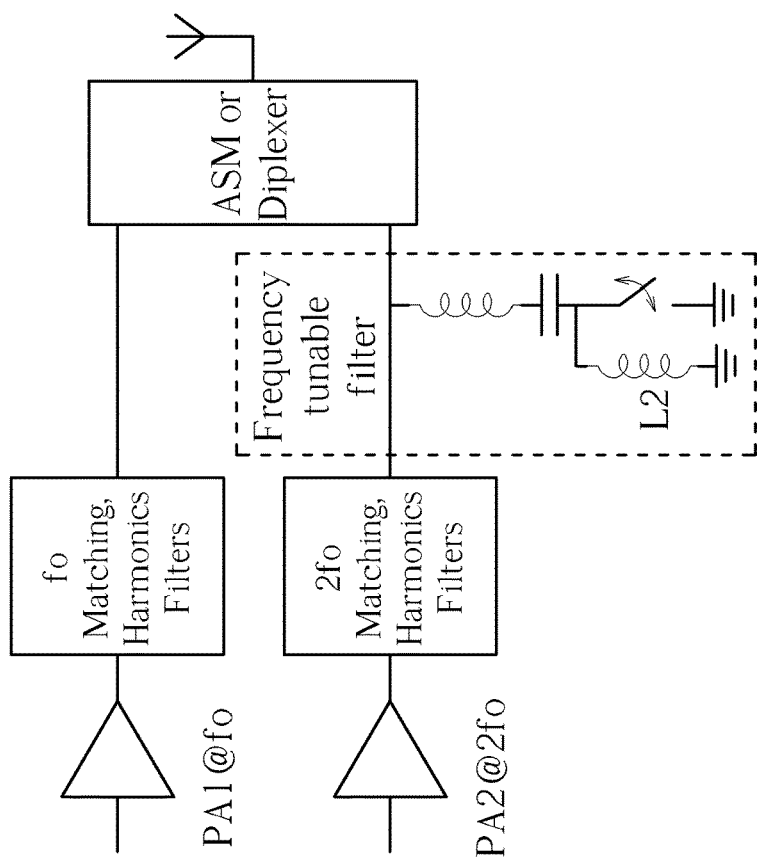
FIG. 3 illustrates a control scheme involved with the frequency tunable filter shown in FIG. 1 according to another embodiment of the present invention.

FIG. 3 illustrates a control scheme involved with the frequency tunable filter 110 shown in FIG. 1 according to another embodiment of the present invention. The architecture shown in FIG. 3 can be taken as an example of the transmitter circuit within the electronic device, and the frequency tunable filter shown in FIG. 3 can be taken as an example of the frequency tunable filter 110 shown in FIG. 1. For example, in addition to the frequency tunable filter, the transmitter circuit of this embodiment may comprise at least one PA such as the PA PA1 (labeled "PA1@fo" in FIG. 3) and the PA PA2 (labeled "PA2@2fo" in FIG. 3), and may further comprise first matching and harmonics filters (labeled "fo Matching, Harmonics Filters" in FIG. 3) and second matching and harmonics filters (labeled "2fo Matching, Harmonics Filters" in FIG. 3). In addition, the transmitter circuit of this embodiment may further comprise antenna switch module (ASM) or a diplexer, where the output of the ASM or the diplexer may be coupled to an antenna.

According to this embodiment, the PA PA1 may operate at the frequency band corresponding to the carrier frequency fo, and the PA PA2 may operate at the frequency band corresponding to the carrier frequency 2fo. In addition, the first matching and harmonics filters may perform PA matching and harmonics filtering for the PA PA1, and the second matching and harmonics filters may perform PA matching and harmonics filtering for the PA PA2. For example, the controller 105 may turn on the switching unit 110S to set up the first configuration of the frequency tunable filter shown in FIG. 3, where the PA PA2 is turned on, and the second terminal of the LC resonator 110R such as the LC filter shown in FIG. 2 is electrically connected to the ground terminal for PA harmonic matching (e.g. 3.8 GHz). In another example, the controller 105 may turn off the switching unit 110S to set up the second configuration of the frequency tunable filter shown in FIG. 2, where the PA PA2 is turned off, and the second terminal of the LC resonator 110R such as the LC filter that is connected in series with the L or C unit 110LC such as the inductor L2 may resonate at a rejection frequency (e.g. 1.9 GHz) the second harmonic coupled from the PA PA1, the frequency that is lower than $1/(2*\pi*(L*C^{1/2}))$.

In a situation where the electronic device is designed to have the capability of performing wireless communications based on various wireless communications technologies (e.g. GSM technologies, EDGE technologies, High Speed Packet Access (HSPA) technologies, etc.), a large output signal of one PA (e.g. a GSM PA or a Wi-Fi PA) such as the PA PA1 may have fundamental, second harmonic and higher order harmonics terms. If the output harmonics from the PA PA1 is coupled to the output path of the PA PA2, the output matching filters of the PA PA2, such as the second matching and harmonics filters (labeled "2fo Matching, Harmonics Filters" in FIG. 3), cannot filter out the coupled harmonic signal of the second harmonic term (i.e. the 2fo harmonic) within these output harmonics since the coupled harmonic signal having the frequency of 2fo is an in-band signal for the PA PA2. Then, the second harmonic on the output path of the PA PA1 will be passed to the antenna 1 through the output of the PA PA2. Although there may be an ASM coupled to the output of the PA PA2, such as the ASM mentioned above, the isolation of the antenna switch in the ASM may be only −20 dB. If the power of the coupled harmonic signal of the second harmonic term (i.e. the 2fo harmonic) within these output harmonics from the PA PA1 is over −10 dBm, then it would cause a product being failing to pass the Federal Communications Commission (FCC) specifications. This problem can be resolved by using the frequency tunable filter 110 such as the frequency tunable filter shown in FIG. 3.

According to some embodiments, the frequency tunable filter 110 may include the switching unit 110S electrically connected in series with the LC resonator 110R and shunt with an inductor (e.g. the inductor L2) or a capacitor (e.g. a capacitor C2 such as that shown in one of the following embodiments) to resonate at a rejection frequency. For example, the controller 105 may turn on the switching unit 110S to set up the first configuration of the frequency tunable filter 110 when the PA PA1 is turned on, and the LC resonator 110R (e.g. the LC filter) having its second terminal electrically connected to the ground terminal (i.e. short to ground) may be utilized for PA matching of the PA PA2. In another example, the controller 105 may turn off the switching unit 110S to set up the second configuration of the frequency tunable filter 110, and the LC resonator 110R (e.g. the LC filter) that is electrically connected in series with the inductor L2 would resonate at the corresponding rejection frequency, the frequency that is lower than $1/(2*\pi*(L*C)^{1/2})$.

According to some embodiments, the stressed voltage at the switch input of the switching unit 110S is much smaller than the voltage at the PA output (e.g. the output of the PA PA1 or the output of the PA PA2), so the reliability of the switching unit 110S should be good. For example, the switching unit 110S can be regarded as a voltage stressed relaxed switch. According to some embodiments, the proposed matching elements such as that in the frequency tunable filter 110 may be placed at the output of the PA (e.g. the output of the PA PA1 or the output of the PA PA2), between one of the PAs and the associated PA matching networks (e.g. between the PA PA1 and the first matching and harmonics filters, or between the PA PA2 and the second matching and harmonics filters) for smaller in-band loss. According to some embodiments, the LC resonator 110R such as the LC filter may not be affected by the off-state resistance of the switching unit 110S (i.e. the resistance of the switching unit 110S in the off state thereof), which means the LC resonator 110R such as the LC filter can have good rejection.

Figure 4:
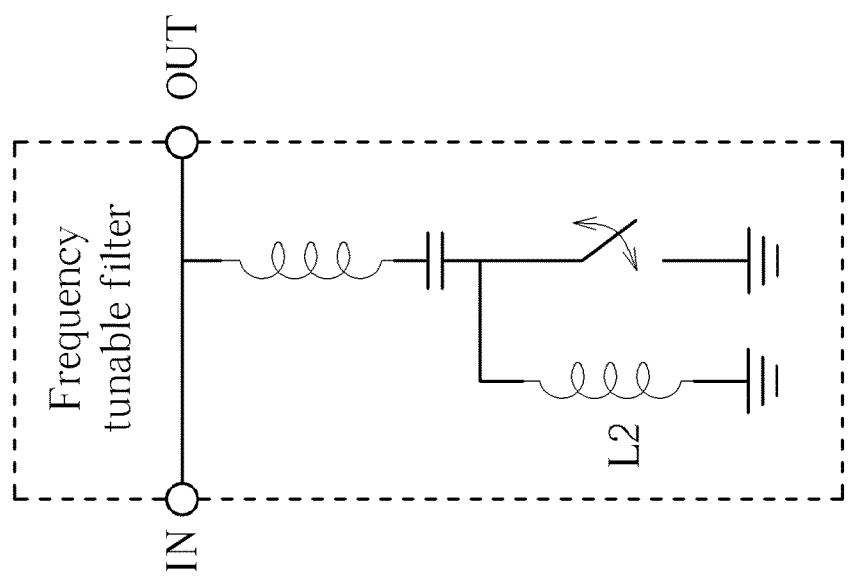
FIG. 4 illustrates some implementation details of the frequency tunable filter shown in FIG. 1 according to an embodiment of the present invention.

FIG. 4 illustrates some implementation details of the frequency tunable filter 110 shown in FIG. 1 according to an embodiment of the present invention. As shown in FIG. 4, the frequency tunable filter 110 (e.g. a two port filter) may comprise the switching unit 110S electrically connected in series with the LC resonator 110R and shunt with the inductor L2 to the ground terminal. For example, the controller 105 may turn on the switching unit 110S to set up the first configuration of the frequency tunable filter 110, where the second terminal of the LC resonator 110R (e.g. the LC filter) is electrically connected to the ground terminal (i.e. short to ground) through the switching unit 110S. In another example, the controller 105 may turn off the switching unit 110S to set up the second configuration of the frequency tunable filter 110, and the LC resonator 110R (e.g. the LC filter) that is electrically connected in series with the inductor L2 would resonate at the corresponding rejection frequency, the frequency that is lower than $1/(2*\pi*(L*C)^{1/2})$.

Figure 5:
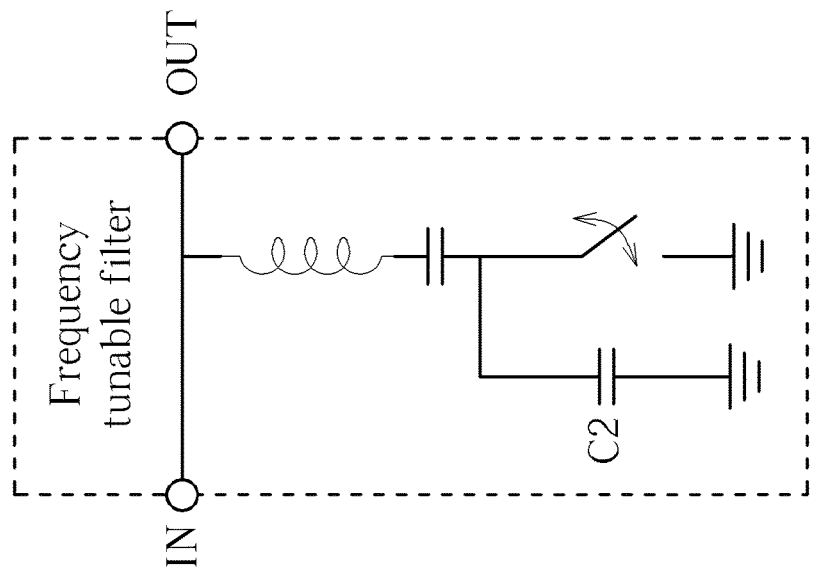
FIG. 5 illustrates some implementation details of the frequency tunable filter shown in FIG. 1 according to another embodiment of the present invention.

FIG. 5 illustrates some implementation details of the frequency tunable filter 110 shown in FIG. 1 according to another embodiment of the present invention. As shown in FIG. 5, the frequency tunable filter 110 (e.g. the two port filter) may comprise the switching unit 110S electrically connected in series with the LC resonator 110R and shunt with the capacitor C2 to the ground terminal.

For example, the controller 105 may turn on the switching unit 110S to set up the first configuration of the frequency tunable filter 110, where the second terminal of the LC resonator 110R (e.g. the LC filter) is electrically connected to the ground terminal (i.e. short to ground) through the switching unit 110S. In another example, the controller 105 may turn off the switching unit 110S to set up the second configuration of the frequency tunable filter 110, and the LC resonator 110R (e.g. the LC filter) that is electrically connected in series with the capacitor C2 would resonate at the corresponding rejection frequency, the frequency that is higher than $1/(2*\pi*(L*C)^{1/2})$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency tunable filter coupled to a power amplifier, comprising:
    a plurality of ports comprising an input port and an output port;
    an inductor-capacitor (LC) resonator, wherein the LC resonator comprises a first terminal coupled to the input port and the output port, and further comprises a second terminal;
    a resonance adjustment unit, coupled between the LC resonator and a ground terminal of the frequency tunable filter, arranged to selectively change a resonance characteristic of the LC resonator; and
    a switching unit, coupled between the LC resonator and the ground terminal, arranged to disable the resonance adjustment unit by providing a conduction path between the second terminal of the LC resonator and the ground terminal based on a signal from a controller when the power amplifier operates in a first wireless communication mode, and enable the resonance adjustment unit by blocking the conduction path between the second terminal of the LC resonator and the ground terminal based on the signal from the controller when the power amplifier operates in a second wireless communication mode.

2. The frequency tunable filter of claim 1, wherein the input port and the output port are coupled to each other.

3. The frequency tunable filter of claim 1, wherein the LC resonator comprises an inductor and a capacitor.

4. The frequency tunable filter of claim 1, wherein the switching unit comprises a field effect transistor.

5. The frequency tunable filter of claim 1, wherein the resonance adjustment unit comprises an inductor or a capacitor.

6. The frequency tunable filter of claim 1, wherein when the frequency tunable filter is of a first configuration, the switching unit provides the conduction path between the second terminal of the LC resonator and the ground terminal.

7. The frequency tunable filter of claim 6, wherein when frequency tunable filter is of the first configuration, switching unit disables the resonance adjustment unit by providing the conduction path between the second terminal of the LC resonator and the ground terminal.

8. The frequency tunable filter of claim 1, wherein when the frequency tunable filter is of a second configuration, the switching unit blocks the conduction path between the second terminal of the LC resonator and the ground terminal.

9. The frequency tunable filter of claim 8, wherein when the frequency tunable filter is of the second configuration, the switching unit enables the resonance adjustment unit by blocking the conduction path between the second terminal of the LC resonator and the ground terminal.

10. The frequency tunable filter of claim 1, wherein the resonance adjustment unit changes the resonance characteristic of the LC resonator according to the conduction path provided by the switching unit between the second terminal of the LC resonator and the ground terminal.

11. An apparatus for performing filtering control in an electronic device, the apparatus comprising:
    a power amplifier capable of operating in a plurality of wireless communication modes; and
    a frequency tunable filter coupled to the power amplifier, comprising:
    a plurality of ports comprising an input port and an output port;
    an inductor-capacitor (LC) resonator, wherein the LC resonator comprises a first terminal coupled to the input port and the output port, and further comprises a second terminal;
    a switching unit, coupled between the LC resonator and a ground terminal of the frequency tunable filter, arranged to selectively provide a conduction path between the second terminal of the LC resonator and the ground terminal depending on a wireless communication mode in which the power amplifier operates, selected from the plurality of wireless communication modes based on a signal from a controller; and
    a resonance adjustment unit, coupled between the LC resonator and the ground terminal, arranged to selectively change a resonance characteristic of the LC resonator.

12. The apparatus of claim 11, wherein the input port and the output port are coupled to each other.

13. The apparatus of claim 11, wherein the LC resonator comprises an inductor and a capacitor.

14. The apparatus of claim 11, wherein the switching unit comprises a field effect transistor.

15. The apparatus of claim 11, wherein the resonance adjustment unit comprises an inductor or a capacitor.

16. The apparatus of claim 11, wherein when the power amplifier operates in a first wireless communication mode of the plurality of wireless communication modes, the frequency tunable filter is of a first configuration, and the switching unit provides the conduction path between the second terminal of the LC resonator and the ground terminal.

17. The apparatus of claim 16, wherein when the frequency tunable filter is of the first configuration, the switching unit disables the resonance adjustment unit by providing the conduction path between the second terminal of the LC resonator and the ground terminal.

18. The apparatus of claim 11, wherein when the power amplifier operates in a second wireless communication mode of the plurality of wireless communication modes, the frequency tunable filter is of a second configuration, and the switching unit blocks the conduction path between the second terminal of the LC resonator and the ground terminal.

19. The apparatus of claim 18, wherein when the frequency tunable filter is of the second configuration, the switching unit enables the resonance adjustment unit by blocking the conduction path between the second terminal of the LC resonator and the ground terminal.

20. The apparatus of claim 11, wherein the resonance adjustment unit changes the resonance characteristic of the LC resonator according to the conduction path provided by the switching unit between the second terminal of the LC resonator and the ground terminal.

21. The frequency tunable filter of claim 1, wherein the first and second wireless communication modes are selected from a plurality of wireless communication modes, the plurality of wireless communication modes comprising Global System for Mobile Communication (GSM) mode, Enhanced Data rates for GSM Evolution (EDGE) mode, and High Speed Packet Access (HSPA) mode.

22. The apparatus of claim 11, wherein the plurality of wireless communication modes comprise Global System for Mobile Communication (GSM) mode, Enhanced Data rates for GSM Evolution (EDGE) mode, and High Speed Packet Access (HSPA) mode.

23. The apparatus of claim 11, wherein:
the power amplifier is a first power amplifier, the first power amplifier configured to operate at a first frequency band;
the apparatus comprises a second power amplifier, the second power amplifier configured to operate at a second frequency band; and
the switching unit is configured to selectively provide the conduction path between the second terminal of the LC resonator and the ground terminal based on the signal from the controller, the signal from the controller indicating whether the first power amplifier is turned on or off.

24. The apparatus of claim 23, wherein outputs of the first and second power amplifiers are coupled to an antenna in parallel via an antenna switch module (ASM) or a diplexer.

* * * * *